(12) United States Patent
Mukai et al.

(10) Patent No.: US 7,115,478 B2
(45) Date of Patent: Oct. 3, 2006

(54) METHOD OF FABRICATING A SEMICONDUCTOR DEVICE AND A METHOD OF GENERATING A MASK PATTERN

(75) Inventors: Kiyohito Mukai, Osaka (JP); Tadashi Tanimoto, Shiga (JP); Mitsumi Ito, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 62 days.

(21) Appl. No.: 10/663,642

(22) Filed: Sep. 17, 2003

(65) Prior Publication Data
US 2004/0083445 A1    Apr. 29, 2004

(30) Foreign Application Priority Data
Sep. 17, 2002    (JP)    ............... P2002-270068

(51) Int. Cl.
*H01L 21/76*    (2006.01)
(52) U.S. Cl. ............... 438/424; 438/427; 438/430; 438/437
(58) Field of Classification Search ............... 438/424, 438/427, 437, 692, 425, 428, 430
See application file for complete search history.

(56) References Cited

U.S. PATENT DOCUMENTS 5,286,927 A * 2/1994 Ueno et al. ............... 174/257
5,702,977 A * 12/1997 Jang et al. ............... 438/427
6,205,658 B1 * 3/2001 Kawano ............... 29/852
2002/0123207 A1 9/2002 Horie et al.

FOREIGN PATENT DOCUMENTS

| JP | 10-22376      | 1/1998  |
| JP | 10-022376     | 1/1998  |
| JP | 2000-232153 A | 8/2000  |
| JP | P2000-232153 A| 8/2000  |
| JP | 2000-340567 A | 12/2000 |
| JP | 2002-334925 A | 11/2002 |
| JP | P2002-334925 A| 11/2002 |

* cited by examiner

*Primary Examiner*—Walter L. Lindsay, Jr.
(74) *Attorney, Agent, or Firm*—McDermott Will & Emery LLP

(57) ABSTRACT

At least a groove for separating a semiconductor substrate into a first region of a relatively large area and a second region of a relatively small area is formed. An insulating film is formed on the surface of the semiconductor substrate including the interior of the groove. The insulating film is etched using an etching mask having a lattice window pattern in such a manner that openings corresponding to the lattice window pattern are formed in the first region. As an alternative, openings corresponding to a single opening pattern are formed in the first region using an etching mask having the single opening pattern and the lattice window pattern, and the insulating film is etched in such a manner that openings corresponding to the lattice window pattern are formed in the second region. In both cases, the remaining insulating film is polished off.

6 Claims, 16 Drawing Sheets

F I G. 6
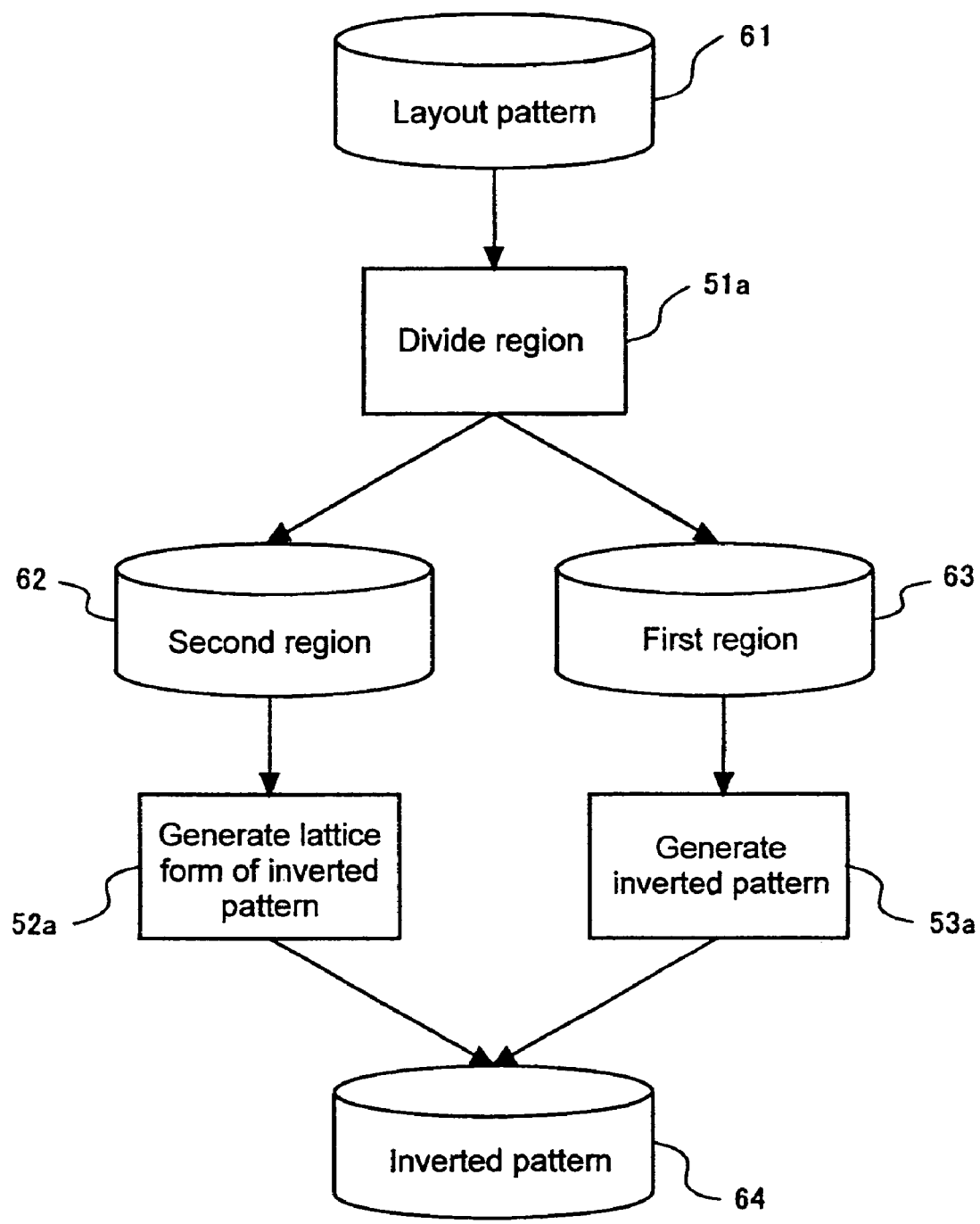

METHOD OF FABRICATING A SEMICONDUCTOR DEVICE AND A METHOD OF GENERATING A MASK PATTERN

BACKGROUND OF THE INVENTION

The present invention relates to a method of fabricating a semiconductor device, or in particular to a technique of reducing the surface misalignment in flattening an insulating film by the CMP (chemical mechanical polishing) process in the STI (shallow trench isolation) method for dividing the surface of a semiconductor substrate into regions by grooves.

The STI method is used to separate semiconductor devices through the process of forming grooves (region dividing grooves) for dividing the surface of a semiconductor substrate into regions, forming an insulating film on the surface of the semiconductor substrate including the interior of the region dividing grooves, and flattening the insulating film.

In the STI method, it is crucial to flatten the divided regions without adversely affecting the surface of the semiconductor substrate in the flattening process. The CMP process is a flattening method which has recently found applications.

FIG. 16 is a diagram for explaining the steps of a method of fabricating a semiconductor device according to the prior art.

The surface of a semiconductor substrate 10 shown in FIG. 16A is formed with region dividing grooves 10a shown in FIG. 16B, so that the substrate 10 is divided by the grooves 10a into a first region Aw which is an active region having a relatively large area and a second region An which is an active region having a relatively small area. Next, as shown in FIG. 16C, an insulating film (oxide film) 11 is formed on the substrate 10 including the interior of the grooves 10a. The insulating film 11 assumes the state buried in the grooves 10a.

Next, as shown in FIG. 16D, the insulating film 11 is covered with an etching mask 12 having a single opening pattern 12c at a position corresponding to the first region Aw. The position of the opening pattern 12c corresponds to that of the insulating film 11w on the first region Aw. The part of the first region Aw where the mask 12 is superposed on the insulating film 11w is designated by Dw.

Under the condition shown in FIG. 16D, the insulating film 11 is etched using the mask 12, and an assembly shown in FIG. 16E is formed. Specifically, only the part of the insulating film 11w of the first region Aw at a position corresponding to the opening pattern 12c of the mask 12 is etched. The etched part is limited to the insulating film 11w on the first region Aw. The part of the insulating film 11w at a position corresponding to the opening pattern 12c is etched off to form an opening 11q. Reference numeral $11w_1$ designates the remaining part of the insulating film at a position corresponding to the superposed region Dw.

Under the condition shown in FIG. 16E, the insulating film 11 is removed from the surface of the substrate 10 by the CMP process. Specifically, the insulating film 11n on the second region An and the remaining part $11w_1$ of the insulating film on the first region Aw are removed to achieve the state in which the insulating film 11 is buried only in the grooves 10a, as shown in FIG. 16F. The insulating film buried in the grooves 10a constitutes buried insulating films 11u.

Ideally, the upper surface of each buried insulating film 11u and the upper surface of the substrate 10 are flattened in a flush state with each other.

In the prior art, the process of etching off the insulating film is aimed only at the first region having a relatively large area. Specifically, the insulating film in the second region having a relatively small area is not removed. As a result, in the next CMP process, the presence of the insulating film lacks uniformity, and a large misalignment develops between the surface of the insulating film in each dividing groove and the surface of the semiconductor substrate.

In forming the gate electrode of a transistor, for example, a large surface misalignment causes the thickness irregularities of the polycrystalline silicon film formed on the semiconductor substrate. As a result, an etching residue is liable to remain on the polycrystalline silicon film. Inconveniently, this residue often causes the shorting between the gate electrodes or between the gate electrode and other wiring layers.

In the case where the CMP process is executed to avoid this inconvenience with the insulating film set to the same surface height as the semiconductor substrate, an overpolishing develops locally. Then, the characteristics of the semiconductor device formed in the active region are adversely affected.

SUMMARY OF THE INVENTION

Accordingly, the primary object of this invention is to provide a method of fabricating a semiconductor device and a method of generating a mask pattern, in which the local overpolishing is prevented, and the misalignment between the surface of an insulating film in the region dividing grooves and the surface of a semiconductor substrate is reduced thereby improving the flatness of the surface of the semiconductor substrate.

The above and other objects, features and advantages will be made apparent by the detailed description given in conjunction with the accompanying drawings.

As a first solution for the problem described above, according to the invention, there is provided a method of fabricating a semiconductor device comprising the steps described below.

Specifically, in the first step, region dividing grooves are formed for separating the surface of a semiconductor substrate into a first region having a relatively large area and a second region having a relatively small area.

In the second step, in order to bury an insulating film in the region dividing grooves, the insulating film is formed on the surface of the semiconductor substrate. By forming this insulating film, the interior of the region dividing grooves is also filled with the insulating film. The insulating film is required to be formed only inside the region dividing grooves, and the insulating film on the surface of the semiconductor substrate is required to be removed. For this purpose, the insulating film is etched in the third step.

In the third step, the insulating film is etched using an etching mask having a lattice window pattern in such a manner as to form a lattice opening corresponding to the lattice window pattern in the first region.

In the fourth step, the insulating film remaining on the semiconductor substrate after etching is polished off. As a result, the surface of the semiconductor substrate is exposed, and the insulating film assumes the state buried in the region dividing grooves.

In short, according to this invention, there is provided a method of fabricating a semiconductor device, comprising the first step for forming at least a region dividing groove for separating the surface of a semiconductor substrate into a first region making up an active region having a relatively large area and a second region making up an active area having a relatively small area, the second step for forming an insulating film on the surface of the semiconductor substrate including the interior of the region dividing grooves, the third step for etching the insulating film using an etching mask having a lattice window pattern in such a manner that a lattice opening corresponding to the lattice window pattern is formed in the first region, and the fourth step for polishing off the insulating film remaining on the semiconductor substrate.

This invention is explained by comparison with the prior art. In the prior art, an insulating film is etched using a single opening pattern in such a manner as to form an opening corresponding to the opening pattern in the first region. As a result, the area of the opening in the first region is comparatively large and therefore the presence of the insulating film in the first region is small. The insulating film presence is defined as the ratio which the area of the insulating film existing on the surface of the semiconductor substrate represents per unit area of the semiconductor substrate. In the prior art, the opening area is large and the insulating film presence is small in the first region. In polishing off the insulating film, therefore, the overpolishing is liable to be caused more often in the first region than in the second region having a sufficiently large insulating film presence. This constitutes a cause of generating a misalignment between the surface of the insulating film in the region dividing grooves and the surface of the semiconductor substrate.

According to this invention, in contrast, the insulating film in the first region is etched using an etching mask having a lattice window pattern instead of a single opening pattern. Specifically, the insulating film is etched with the lattice window pattern at a position corresponding to the first region in such a manner that a lattice opening corresponding to the lattice window pattern is formed in the first region. The total area of the lattice opening is smaller than that of a single opening. A frame-like lattice portion remains between the adjoining lattice openings. The insulating film presence in the first region is proportionately increased as compared to the single opening of the prior art. The insulating film presence in the first region which otherwise might be low increases, and therefore the insulating film presence in the first region approaches the insulating film presence in the second region. As a result, in the polish-off process, the amount polished off in the first region can be made to approach the amount polished off in the second region.

Specifically, the thickness reduction rate of the insulating film in the polishing process is controlled by adjusting the insulating film presence, and a uniform reduction rate of the insulating film thickness can be secured over the whole surface of the insulating film. Thus, the local overpolishing is prevented thereby reducing the misalignment between the surface of the insulating film in the region dividing grooves and the surface of the semiconductor substrate. In other words, the heights of the two surfaces are equalized. As a result, the surface flatness of the semiconductor substrate is improved for improved characteristics of the semiconductor device.

The aforementioned solution is intended to equalize the insulating film presence in the first and second regions by adding a lattice to the single opening in the first region according to the prior art and hence increasing the otherwise low insulating film presence in the first region. On the other hand, another solution described below is intended to reduce the otherwise higher insulating film presence in the second region and thus to equalize the insulating film presence in the first and second regions, by adding an opening to the second region while leaving the single opening in the first region as it is. The difference between the two solutions lies in which is added, a lattice or an opening.

As a second solution for the problem described above, according to this invention, there is provided a method of fabricating a semiconductor device comprising the steps described below.

Specifically, in the first step, the surface of the semiconductor substrate is formed with region dividing grooves for separating the substrate surface into a first region making up an active region of a relatively large area and a second region making up an active region of a relatively small area.

In the second step, an insulating film is formed on the surface of the semiconductor substrate including the interior of the region dividing grooves.

In the third step, the insulating film is etched using an etching mask having a single opening pattern and a lattice window pattern in such a manner that a single opening corresponding to the single opening pattern is formed in the first region and a lattice opening corresponding to the lattice window pattern is formed in the second region.

In the fourth step, the insulating film remaining on the semiconductor substrate is polished off.

The first, second and fourth steps are identical to the corresponding steps of the solution described above. The feature of the second solution lies in the third step.

The insulating film in the first region is etched using a mask pattern having a single opening pattern like in the prior art. In the second solution, however, the insulating film of the second region, which is not etched in the prior art, is also etched. Specifically, the lattice window pattern is placed at a position corresponding to the second region. By doing so, the insulating film is etched in such a manner that a lattice opening corresponding to the lattice window pattern is formed in the second region. Thus, the lattice opening not formed in the prior art is formed in the second region. As compared to the prior art lacking the opening, therefore, the insulating film presence is reduced in the second region. The otherwise high insulating film presence in the second region is thus reduced, and therefore the insulating film presence in the second region approaches that in the first region. This way, the amount of the insulating film polished off in the first region is made to approach the amount of the insulating film polished off in the second region by the polish-off process. Specifically, the thickness reduction rate of the insulating film in the polishing process is controlled by adjusting the insulating film presence, and thus the film thickness reduction rate can be equalized over the entire surface of the insulating film. As a result, the local overpolishing can be prevented, thereby reducing the misalignment between the surface of the insulating film in the region dividing grooves and the surface of the semiconductor substrate. In other words, the heights of the two surfaces are equalized. Consequently, the surface flatness of the semiconductor substrate is improved for improved characteristics of the semiconductor device.

Preferably, with regard to the lattice window pattern of the etching mask, the superposed width thereof with the active area is set smaller than the superposed width thereof with the single opening pattern.

By doing so, even with an active region having a small area, an inverted pattern can be generated. With a lattice form having a reduced superposed width, the mechanical strength of the insulating film after etching is increased. As a result, the insulating film can be polished off in a stable fashion, thereby easily controlling the exposure reaching the surface of the semiconductor substrate.

A method of generating a mask pattern according to the invention is explained below.

A first method of generating a mask pattern according to the invention comprises the steps of inputting a layout pattern to divide the layout pattern into a plurality of regions according to a predetermined rule and generating an inverted pattern in one of a plurality of the divided regions to generate a mask pattern deformed into a lattice form.

This method of generating a mask pattern for an etching mask corresponds to the first solution described above. According to this invention, the local overpolishing is prevented in such a manner as to suit the layout pattern used. A mask pattern for an inverted pattern with a lattice form can thus be generated with the insulating film presence equalized between the first and second regions. This mask pattern effectively improves the surface flatness of the semiconductor substrate.

As another solution, according to this invention, there is provided a second method of generating a mask pattern, comprising the steps of inputting a layout pattern and dividing the layout pattern into a plurality of regions according to a predetermined rule, generating an inverted pattern in a given one of a plurality of the divided regions, generating an inverted pattern in another one of a plurality of the regions and deforming the inverted pattern into a lattice form, and combining the inverted pattern with the lattice inverted pattern. In this method, the step of generating an inverted pattern and the step of a latticed inverted pattern may be executed in either the described order or the reverse order or at the same time.

This method is for generating a mask pattern for an etching mask corresponding to the second solution described above. According to this invention, the local overpolishing is prevented in a manner suiting a great variety of layout patterns included in the layout pattern data base. A mask pattern thus is generated by combining an inverted pattern and a latticed inverted pattern. This mask pattern is effective for equalizing the insulating film presence between the first and second regions and improving the flatness of the surface of the semiconductor substrate.

According to another aspect of the invention, a method of generating a mask pattern preferably comprises the steps of inputting a layout pattern and determining the amount of the surface misalignment by simulation of the input layout pattern, and selecting one of the first and second methods of generating a mask pattern described above in accordance with whether the simulated surface misalignment is minor or not.

In this method, the misalignment is simulated for the layout pattern used, and depending on whether the simulated surface misalignment is minor or crucial, the first or second method of generating a mask pattern is selected. Specifically, a mask pattern is generated while optimizing the applicable method of generating a mask pattern. As a result, a mask pattern can be generated based on an inverted pattern in an optimum state. Thus, the local overpolishing is prevented in a manner suitable for the layout pattern used. Also, a mask pattern can be generated based on the optimum inverted pattern for equalizing the insulating film presence between the first and second regions. This mask pattern effectively improves the surface flatness of the semiconductor substrate.

Each of the mask pattern generating methods described above preferably further comprises the steps of determining the amount of the surface misalignment by simulation of the generated mask pattern and collating the amount of the simulated surface misalignment with an anticipated value based on the predetermined rule and in the case where the result of collation fails to meet predetermined conditions, altering the predetermined rule and repeating each of the steps.

In this method, the misalignment is simulated for the generated mask pattern, and in the case where the result of collation between the amount of the simulated surface misalignment and the anticipated value is unsatisfactory, the predetermined rule (width, interval, density, shape, etc.) is altered. Based on the rule thus altered, a similar process is repeated in order to satisfy the result of collation of the misalignment simulation. This way, a mask pattern is generated while at the same time optimizing the applicable rule. As a result, a mask pattern can be generated based on an optimum latticed inverted pattern. The local overpolishing can thus be prevented in a manner suiting a great variety of layout patterns included in the layout database. It is also possible to generate a mask pattern as an optimum latticed inverted pattern for equalizing the insulating film presence between the first and second regions. This mask pattern is effective for improving the surface flatness of the semiconductor substrate.

In the methods described above, the step of determining the amount of the surface misalignment preferably includes the substeps of dividing the layout pattern into a plurality of regions, calculating the density of the pattern of each region and altering the superposed width with the active region or the width of the lattice form in accordance with the pattern density.

By altering the superposed width with the active region or the lattice form width in accordance with the pattern density, the insulating film presence can be equalized for all of a plurality of the divided regions, and a mask pattern most suitable for improving the surface flatness of the semiconductor substrate can be generated by preventing the local overpolishing.

In the method of fabricating a semiconductor device described above, the first and second solutions can be effectively combined by forming a lattice opening in both the first and second regions. In this case, the mask pattern is generated in a form having both a lattice window pattern corresponding to the first region and a lattice window pattern corresponding to the second region.

The foregoing and other aspects will become apparent from the following description of the invention when considered in conjunction with the accompanying drawings.

BRIEF DESCRIPTION OF THE DRAWINGS

FIG. 1 is a diagram for explaining the steps of a method of fabricating a semiconductor device according to a first embodiment of the invention, in which

FIG. 2 is a diagram for explaining the steps of a method of fabricating a semiconductor device according to a second embodiment of the invention, in which

FIG. 6 is a flowchart showing a specific example according to the fourth embodiment of the invention.

FIG. 7 is a plan view showing the shape of a mask pattern according to the fourth embodiment, in which

FIG. 16 is a diagram for explaining the steps of the conventional method of fabricating a semiconductor device, in which

In all these drawings, like components are indicated by the same numerals.

DESCRIPTION OF THE PREFERRED EMBODIMENTS

A method of fabricating a semiconductor device according to preferred embodiments of the invention is explained in detail below with reference to the accompanying drawings.

(First Embodiment)

According to this embodiment, the problems are solved by processing an etching mask in the first region (an active region having a relatively large area).

FIG. 1 shows the process, step by step, for a method of fabricating a semiconductor device according to the first embodiment of the invention.

Figure 1A:
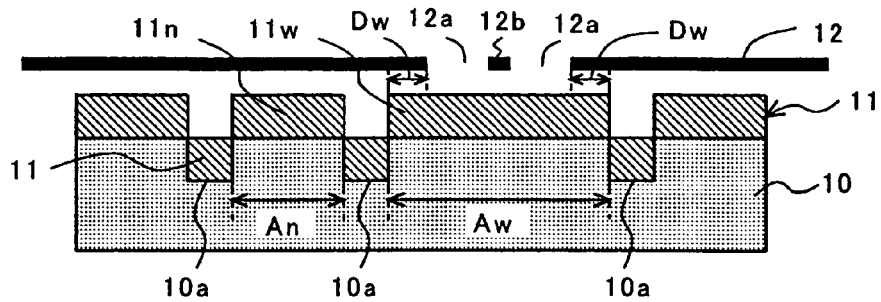
FIG. 1A is a sectional view showing the state in which an insulating film is covered with an etching mask.
Figure 16A:
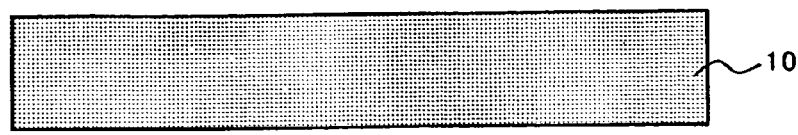
FIG. 16A is a sectional view showing a semiconductor substrate.
Figure 16B:
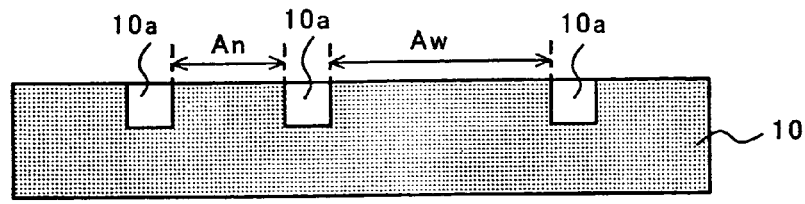
FIG. 16B is a sectional view showing the state in which region dividing grooves are formed.
Figure 16C:
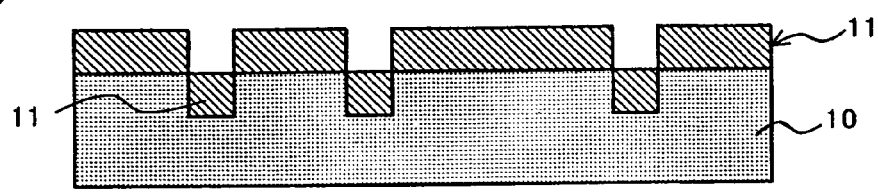
FIG. 16C is a sectional view showing the state in which an insulating film is formed on the substrate.
Figure 16D:
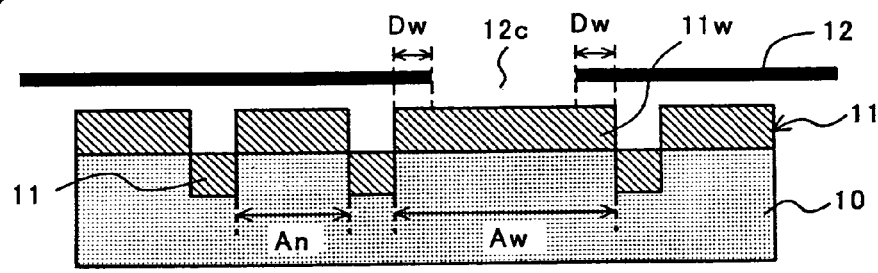
FIG. 16D is a sectional view showing the state in which the insulating film is covered with an etching mask.
Figure 16E:
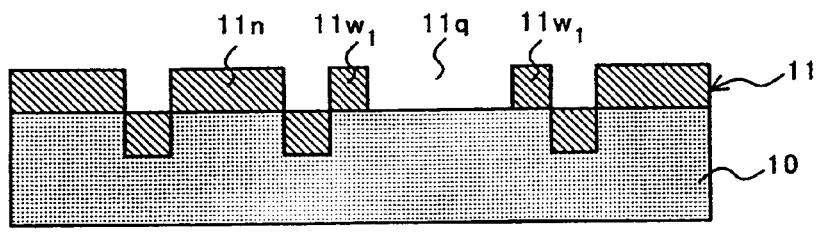
FIG. 16E is a sectional view showing the state in which the insulating film is etched using the mask.
Figure 16F:
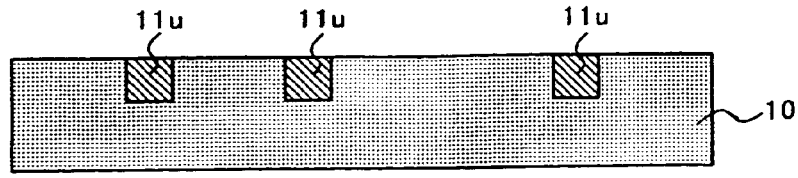
FIG. 16F is a sectional view showing the state in which the insulating film on the substrate surface is removed by the CMP process.

As shown in FIG. 1A, grooves 10a for separating the semiconductor devices are formed on the surface of a semiconductor substrate 10, and an insulating film (oxide film) 11 is formed over the substrate 10 including the interior of the grooves 10a. The insulating film 11 assumes the form buried in the grooves 10a. The process up to this step is similar to the corresponding process shown in FIGS. 16A to 16C.

The insulating film 11 is covered with an etching mask 12. The mask 12 has a lattice window pattern 12a with openings in the first region Aw. The first region Aw is an active region having a relatively large area. Numeral 12b designates a lattice portion making up the lattice window pattern 12a.

The insulating film 11 is covered with the mask 12 with the openings of the lattice window pattern 12a at a position corresponding to the first region Aw. The resulting state is shown in FIG. 1A.

Figure 1B:
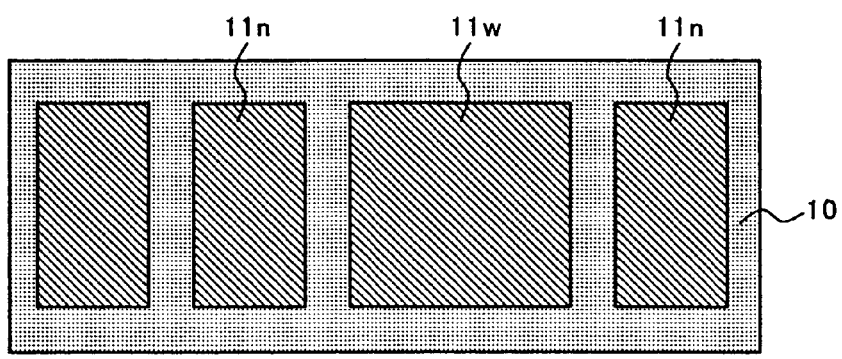
FIG. 1B is a plan view showing an insulating film on the substrate, including an insulating film on the first region and an insulating film on the second region.

FIG. 1B shows the insulating film 11 on the substrate 10, including an insulating film 11w on the first region Aw and an insulating film 11n on the second region An. The second region An is an active region having a relatively small area.

Figure 1C:
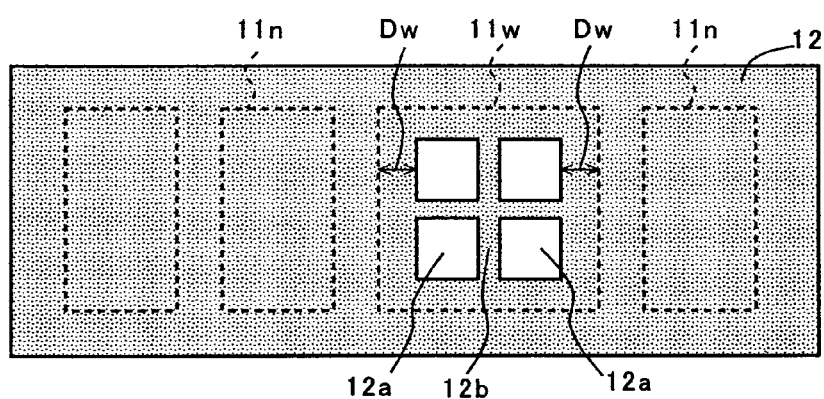
FIG. 1C is a plan view showing the etching mask.

FIG. 1C shows the mask 12. A lattice portion 12b is located at a position corresponding to the central portion of the insulating film 11w on the first region Aw. The lattice window pattern 12a is located at a position corresponding to the insulating film 11w on the first region Aw. Character Dw designates a region where the mask 12 is superposed on the insulating film 11w in the first region Aw. The width of the lattice portion 12b and the width of the superposed region Dw are about 0.5 to 1.0 µm, for example.

Figure 1D:
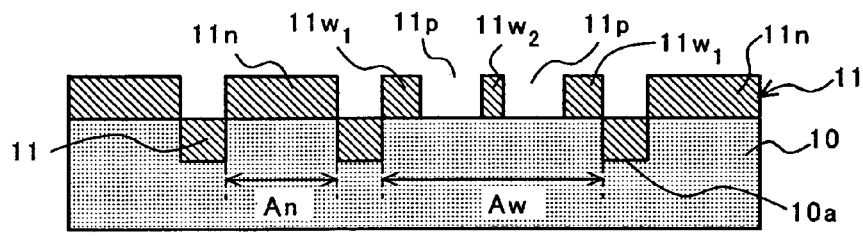
FIG. 1D is a sectional view showing the state in which the insulating film is etched using a mask.

The insulating film 11 is etched using the mask 12 in the state shown in FIG. 1A thereby to produce the assembly shown in FIG. 1D. Specifically, only the portion of the insulating film 11 at a position corresponding to the openings of the lattice window pattern 12a is etched. The etched portion is limited to the insulating film 11w on the first region Aw. The portion of the insulating film 11w at a position corresponding to the lattice window pattern 12a forms lattice openings 11p etched off. Numeral $11w_1$ designates the remaining portion of the insulating film at a position corresponding to the superposed region Dw, and numeral $11w_2$ the remaining portion of the insulating film at a position corresponding to the lattice portion 12b. The insulating film 11n on the second region An remains in the original state.

As compared to the prior art (FIG. 16), the feature of this embodiment lies in that the remaining portion $11w_2$ of the insulating film at a position corresponding to the lattice portion 12b is added.

Figure 1E:
FIG. 1E is a sectional view showing the state in which the insulating film on the substrate surface is removed by the CMP process.

In the state shown in FIG. 1D, the insulating film 11 on the surface of the substrate 10 is removed by the CMP process. Specifically, the insulating film 11n on the second region An and the remaining portions $11w_1$, $11w_2$ of the insulating film on the first region Aw are removed. The resulting assembly is shown in FIG. 1E. As a result, the insulating film 11 assumes the state buried only in the grooves 10a. The insulating film portions buried in the grooves 10a make up buried insulating films 11u. The upper surface of the buried insulating films 11u and the upper surface of the substrate 10 are flattened in a flush state with each other.

Unlike in the prior art, the remaining portion $11w_2$ of the insulating film is added to the assembly by the CMP process. The existence of this remaining portion $11w_2$ equalizes the thickness reduction rate over the entire surface of the insulating film 11 being polished.

The insulating film presence η after etching the insulating film 11 is defined, regardless of the first region Aw or the second region An, as the ratio which the area of the insulating film 11 existing on the upper surface of the substrate 10 represents per unit area of the substrate 10.

In the prior art, the insulating film presence η is so unbalanced that it is large in the second region An and small in the first region Aw. As a result, the insulating film 11w on the first region Aw is removed excessively.

According to this embodiment, in contrast, the portion $11w_2$ of the insulating film is made to remain by the provision of the lattice portion 12b. As a result, the insulating film presence η in the first region Aw approaches the insulating film presence η in the second region An. The excessive removal of the insulating film 11w is thus suppressed, so that the upper surface of the buried insulating films 11u and the upper surface of the substrate 10 are flattened in a flush state with each other.

Specifically, the control operation for removing the insulating film in the etching process can be improved by adjusting the shape and the dimensions of the pattern of the etching mask. Also, the entire surface of the assembly can be equalized by the CMP process, so that the surface of the semiconductor substrate can be flattened with high accuracy.

(Second Embodiment)

In this embodiment, the problems are solved by processing an etching mask in the second region (an active region having a relatively small area).

FIG. 2 shows the process, step by step, for a method of fabricating a semiconductor device according to a second embodiment of the invention.

Figure 2A:
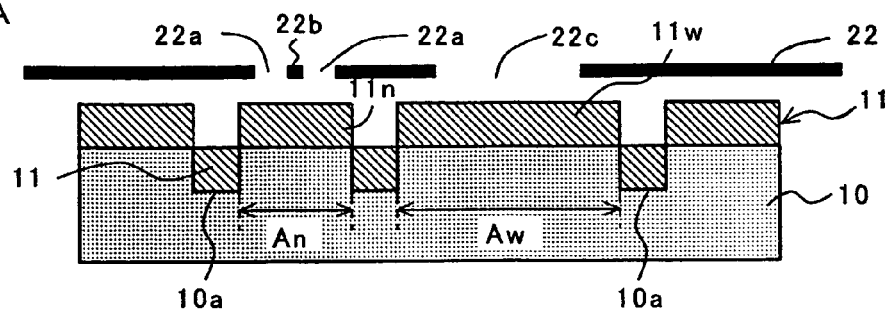
FIG. 2A is a sectional view showing the state in which an insulating film is covered with an etching mask.

In FIG. 2A, like in the first embodiment (FIG. 1), grooves 10a for separating the semiconductor devices are formed on the semiconductor substrate 10, and an insulating film 11 is formed on the substrate 10 including the interior of the grooves 10a. The insulating film 11 assumes the form buried in the grooves 10a.

A mask 22 for etching the insulating film 11 has a lattice window pattern 22a with openings in the second region An. Numeral 22b designates a lattice portion making up the lattice window pattern 22a. As in the prior art, a single opening pattern 22c is formed in the first region Aw.

The insulating film 11 is covered with the mask 22 with the pattern 22c having an opening set at a position corresponding to the first region Aw and the lattice window pattern 22 set at a position corresponding to the second region An. The resulting assembly is shown in FIG. 2A.

Figure 2B:
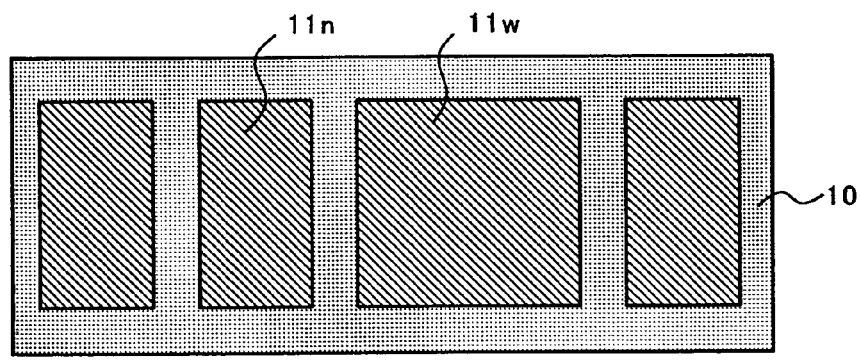
FIG. 2B is a plan view showing the insulating film on the substrate, including an insulating film on the first region and an insulating film on the second region.

FIG. 2B shows the insulating film 11 formed on the substrate 10, including an insulating film 11w on the first region Aw and an insulating film 11n on the second region An.

Figure 2C:
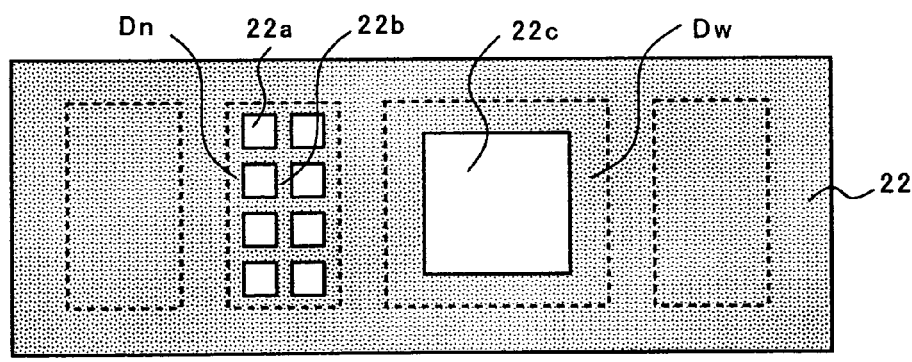
FIG. 2C is a plan view showing the etching mask.

FIG. 2C shows the mask 22. The lattice portion 22b is located at a position corresponding to the central portion of the insulating film 11n on the second region An. The lattice window pattern 22a is located at a position corresponding to the insulating film 11n on the second region An. Character Dn designates a region where the mask 22 is superposed on the insulating film 11w in the second region An, and character Dw a region where the mask 22 is superposed on the insulating film 11w in the first region Aw. The width of the lattice portion 22b and the width of the superposed region Dn in the second region An are about 0.5 to 1.0 µm, for example. The width of the superposed region Dw in the first region Aw, on the other hand, is about 1.0 to 3.0 μm, for example.

Figure 2D:
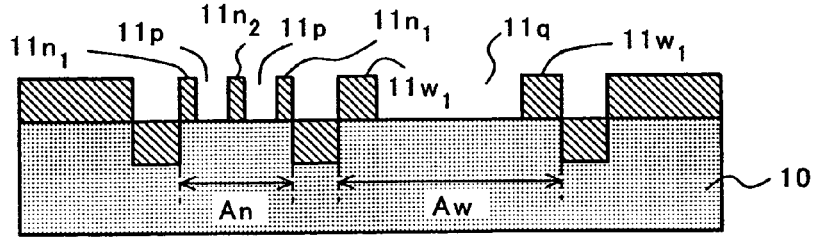
FIG. 2D is a sectional view showing the state in which the insulating film is etched using a mask.

In the state shown in FIG. 2A, the insulating film 11 is etched using the mask 22. The assembly shown in FIG. 2D is produced. Specifically, only the portions of the insulating film 22 at a position corresponding to the openings of the lattice window pattern 22a and the opening pattern 22c are etched. The etched portions include not only the insulating film 11w on the first region Aw but also the insulating film 11n on the second region An.

The portion of the insulating film 11n at a position corresponding to the lattice window pattern 22a is etched off to produce openings 11p. Also, the portion of the insulating film 11w at a position corresponding to the opening pattern 22c is etched off thereby to produce a single opening 11q. Numeral $11n_1$ designates the remaining portion of the insulating film at a position corresponding to the superposed region Dn, numeral $11n_2$ the remaining portion of the insulating film at a position corresponding to the lattice portion 22b, and numeral $11w_1$ the remaining portion of the insulating film at a position corresponding to the superposed region Dw.

As compared to the prior art (FIG. 16), the feature of this embodiment lies in that the openings 11p at a position corresponding to the lattice window pattern 22a are added.

Figure 2E:
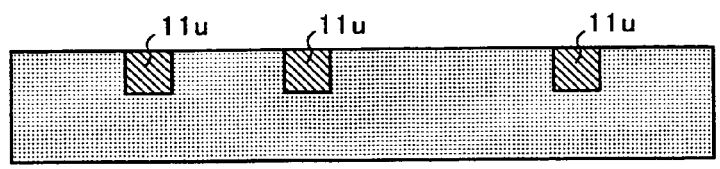
FIG. 2E is a sectional view showing the state in which the insulating film on the substrate surface is removed by the CMP process.

In the state shown in FIG. 2D, the insulating film 11 on the surface of the substrate 10 is removed by the CMP process. Specifically, the remaining portion $11w_1$ of the insulating film on the first region Aw and the remaining portions $11n_1$, $11n_2$ of the insulating film on the second region An are removed. The resulting state is shown in FIG. 2E. As a result, the assembly assumes the state in which the insulating film 11 is buried in the grooves 10a. The insulating films buried in the grooves 10a make up buried insulating films 11u. The upper surface of the buried insulating films 11u and the upper surface of the substrate 10 are flattened in a flush state with each other.

As compared to the prior art, the openings 11p are formed in the second region An by the CMP process. The existence of the openings 11p equalizes the thickness reduction rate over the entire surface of the insulating film 11 in the polishing process. Thus, unlike in the prior art, the excessive removal of the insulating film 11w on the first region Aw is suppressed. As a result, the upper surface of the buried insulating films 11u and the upper surface of the substrate 10 are flattened in a flush state with each other.

The prior art lacks the uniformity due to the fact that the insulating film presence η is large in the second region An and small in the first region Aw. Thus, the insulating film 11w on the first region Aw is excessively removed.

According to this embodiment, in contrast, the provision of the lattice window pattern 22a produces the openings 11p in the second region An. Consequently, the insulating film presence η in the second region An approaches the insulating film presence η in the first region Aw. Thus, the excessive removal of the insulating film 11w on the first region Aw is suppressed, and the upper surface of the buried insulating films 11u and the upper surface of the substrate 10 are flattened in a flush state with each other.

Specifically, the control operation for removing the insulating film in the etching process can be improved by adjusting the shape and dimensions of the pattern of the etching mask. Also, the entire surface of the semiconductor substrate is equalized by the CMP process and thus flattened with high accuracy.

A method of generating a mask pattern embodying the invention is explained below.

(Third Embodiment)

The third embodiment corresponds to the first embodiment in that lattice openings are formed in the first region.

Figure 3:
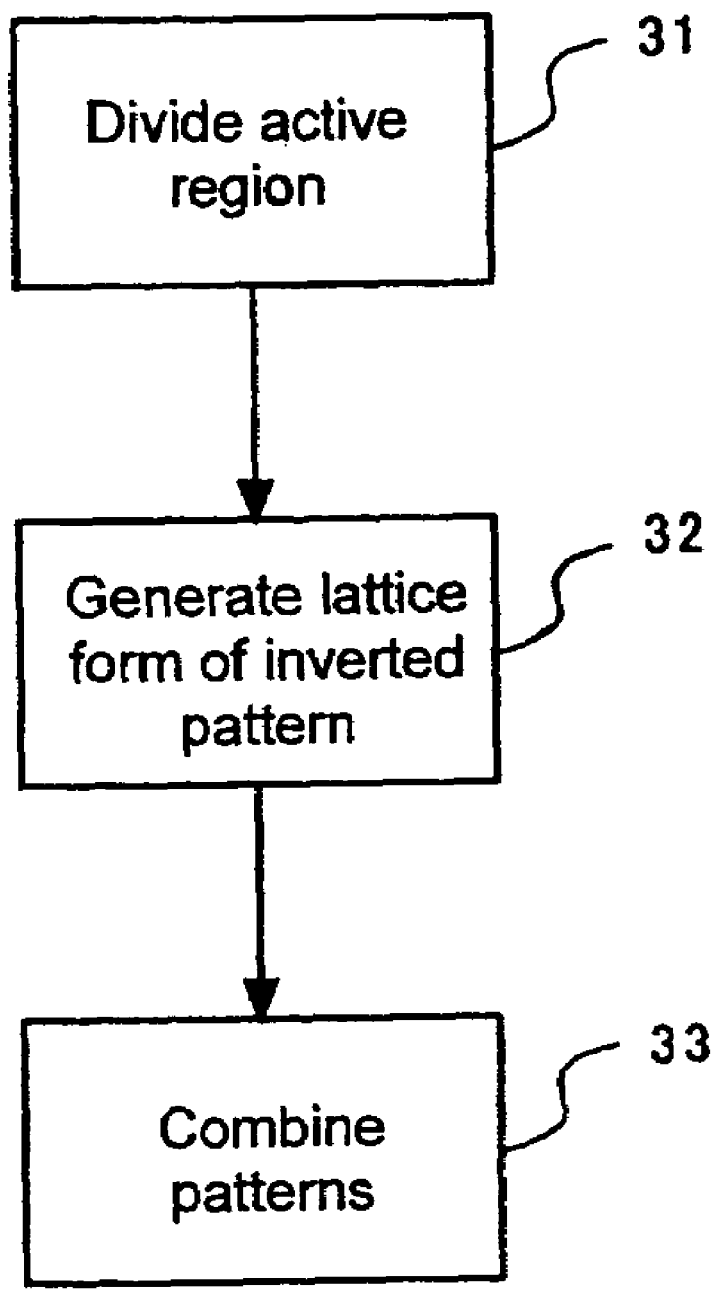
FIG. 3 is a flowchart showing the steps of a method of generating a mask pattern according to a third embodiment of the invention.

FIG. 3 is a flowchart showing the steps of a method of generating a mask pattern according to the third embodiment of the invention.

Step 31 is for dividing an active region. In this step, a layout pattern is input and the active region of the semiconductor device in the layout pattern is divided into a plurality of groups based on a predetermined rule.

Step 32 is for generating the lattice form of an inverted pattern. In this step, an inverted pattern is generated for a specified one of the groups into which the layout pattern is divided in step 31, and the inverted pattern is reshaped into a lattice form.

Step 33 is for combining the patterns. In this step, the pattern of the groups divided in step 31 and processed in step 32 is combined with the pattern not so processed.

Figure 4:
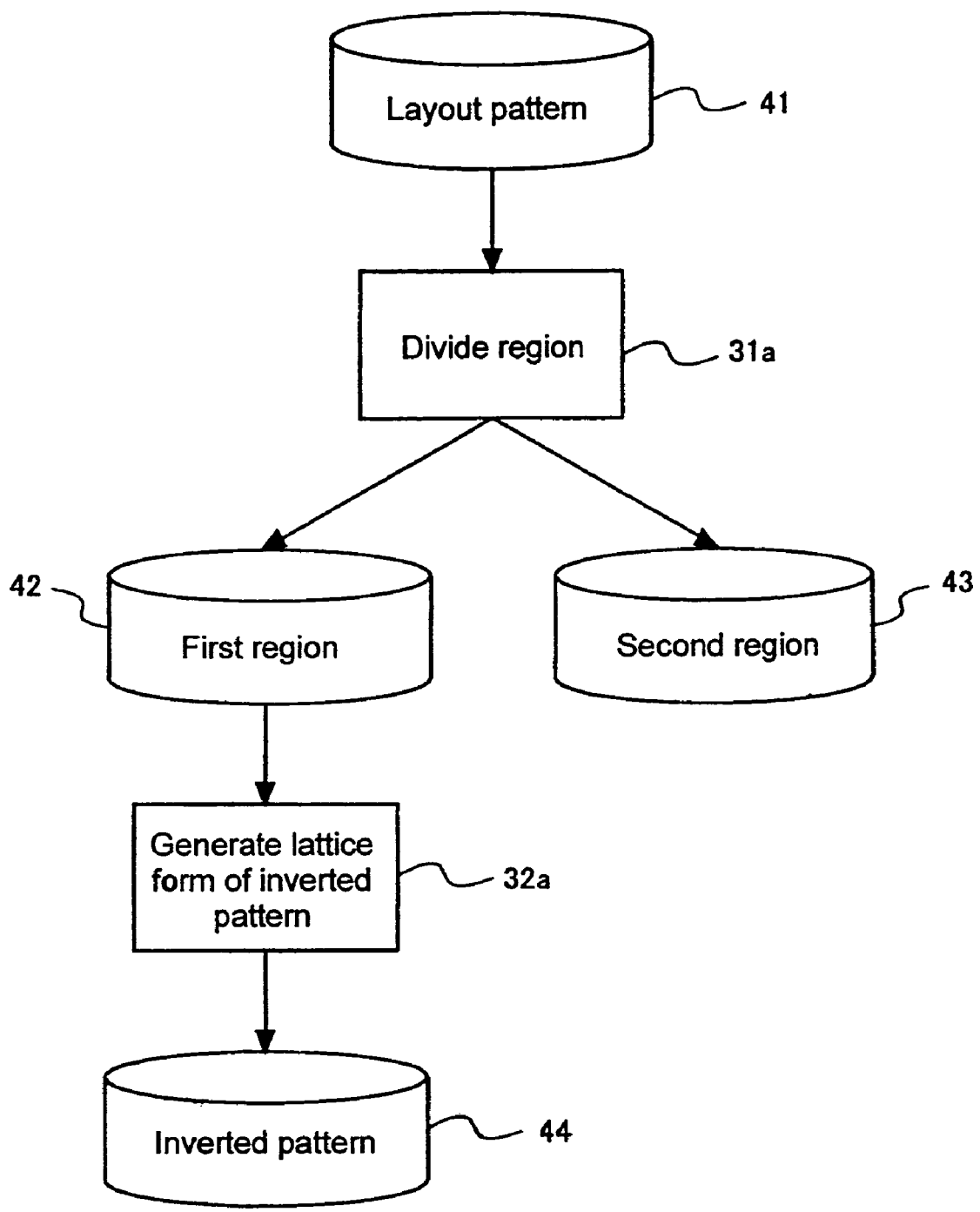
FIG. 4 is a flowchart showing a specific example according to the third embodiment of the invention.

FIG. 4 shows a specific example of this embodiment. First, a layout pattern 41 is input to a region divider 31a corresponding to step 31 in FIG. 3. Based on a predetermined rule, the layout pattern 41 is divided into two regions including a first region 42 and a second region 43. The predetermined rule defines the width, interval, density, etc., for example, of the layout patterns. A device 32a for generating the lattice form of the inverted pattern, which corresponds to step 32 in FIG. 3, is supplied with the data on the first region 42 and generates a lattice form of an inverted pattern for the first region 42 thereby generating a mask pattern (inverted pattern) 44.

As described above, a mask pattern for etching is generated and output based on an input layout pattern. This way, the shape dependency of the mask pattern on the layout pattern for removing the insulating film can be controlled.

(Fourth Embodiment)

The fourth embodiment corresponds to the second embodiment in that a single opening is formed in the first region and lattice openings are formed in the second region.

Figure 5:
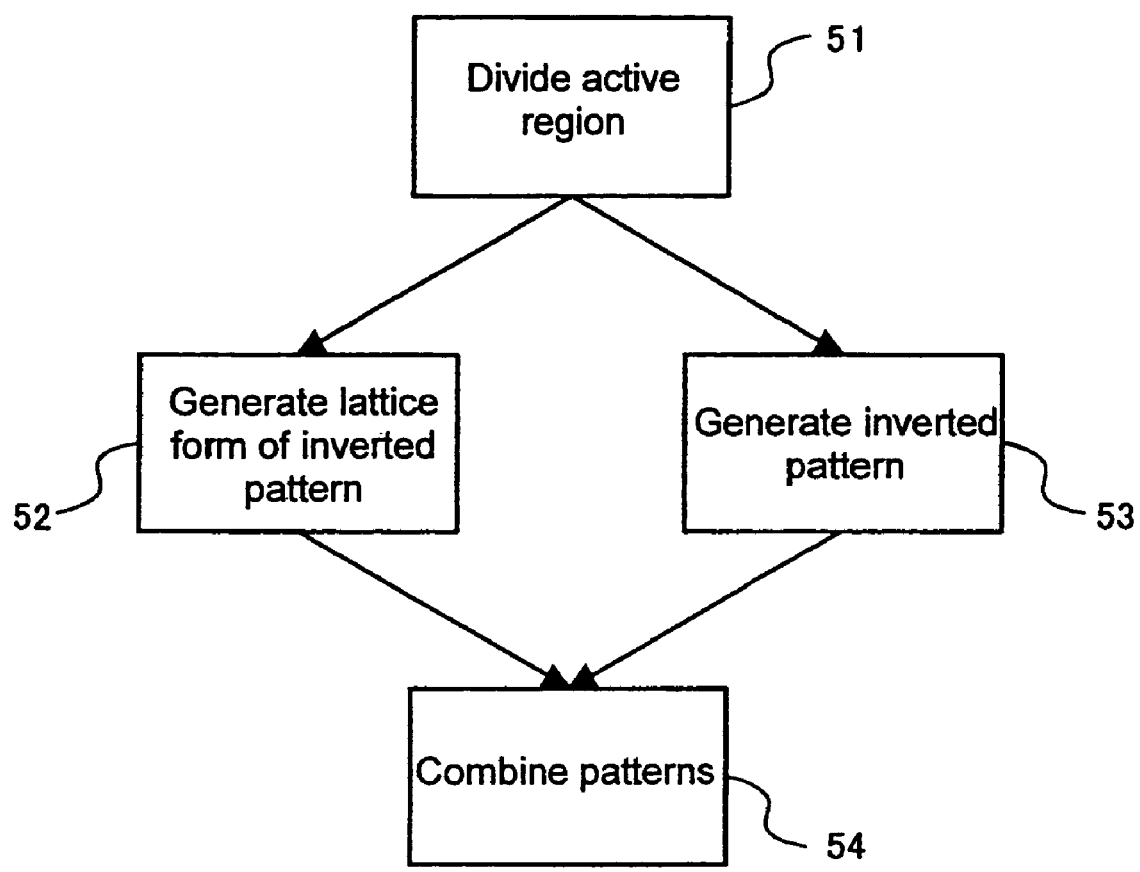
FIG. 5 is a flowchart showing the steps of a method of generating flowchart showing the steps of a method of generating a mask pattern according to a fourth embodiment of the invention.

FIG. 5 is a flowchart showing the steps of a method of generating a mask pattern according to the fourth embodiment of the invention.

Step 51 is for dividing an active region. In this step, a layout pattern is input and the active region of a semiconductor device in the layout pattern is divided into a plurality of groups based on a predetermined rule.

Step 52 is for generating a lattice form of an inverted pattern. In this step, an inverted pattern is generated for a specified one of the layout pattern groups divided in step 51, and the inverted pattern is further reshaped into a lattice form.

Step 53 is for generating an inverted pattern. In this step, an inverted pattern is generated for the layout pattern groups divided in step 51 and not processed in step 52.

Step 54 is for combining the patterns. In this step, the two patterns generated in steps 52 and 53 are combined and output.

FIG. 6 shows a specific example of this embodiment. First, a layout pattern 61 is input and divided into two regions, including a first region 63 and a second region 62 based on a predetermined rule by the region divider 51a corresponding to step 51 in FIG. 5. A device 52a for generating a lattice form of an inverted pattern corresponding to step 52 in FIG. 5 is supplied with the data on the second region 62 and generates a lattice form for an inverted pattern of the second region 62. A device 53a for generating an inverted pattern corresponding to step 53 in FIG. 5, on the other hand, is supplied with the data on the first region 63 and generates an inverted pattern of the first region 63. These two patterns are combined to generate a mask pattern (inverted pattern) 64.

As described above, the shape dependency of the layout pattern for removing the insulating film can be controlled based on a rule for both the active region of a large area configured of a large pattern and the active region of a small area configured of a small pattern. As a result, a mask pattern for etching can be generated with an improved flatness of the semiconductor substrate by the CMP process.

FIG. 7 is a plan view showing the shape of a mask pattern according to this embodiment.

Figure 7A:
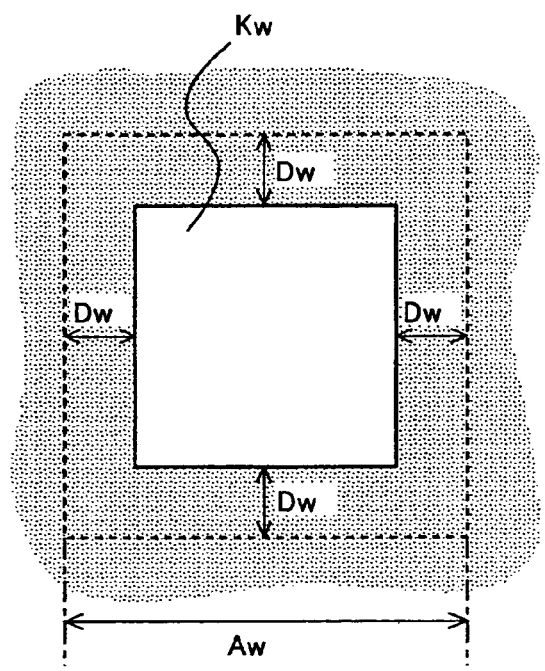
FIG. 7A is a diagram for explaining a single opening pattern in the first region, and FIG. 7B a diagram for explaining a lattice window pattern in the second region.

In FIG. 7A, character Aw designates a first region having a relatively large area, character Kw a single opening pattern of the etching mask, and character Dw a region where the first region Aw and the region of the etching mask other than the opening pattern Kw are superposed. The superposed region Dw has a width of about 1.0 to 3.0 μm.

Figure 7B:
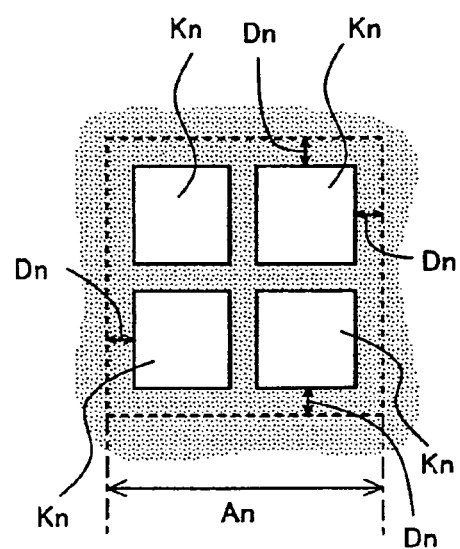

In FIG. 7B, character An designates a second region having a relatively small area, character Kn a plurality of openings of a lattice window pattern for an etching mask, and character Dn a region where the region of the etching mask other than the lattice window pattern Kn and the second region An are superposed. The width of the superposed region Dn is about 0.5 to 1.0 μm.

Taking the form of a lattice exhibits the function as a reinforcing member and is effective for maintaining the mechanical strength. Even for an active region having a relatively small area, therefore, an inverted pattern can be generated for an improved flatness.

(Fifth Embodiment)

The fifth embodiment corresponds to the first embodiment in that lattice openings are formed in the first region.

Figure 8:
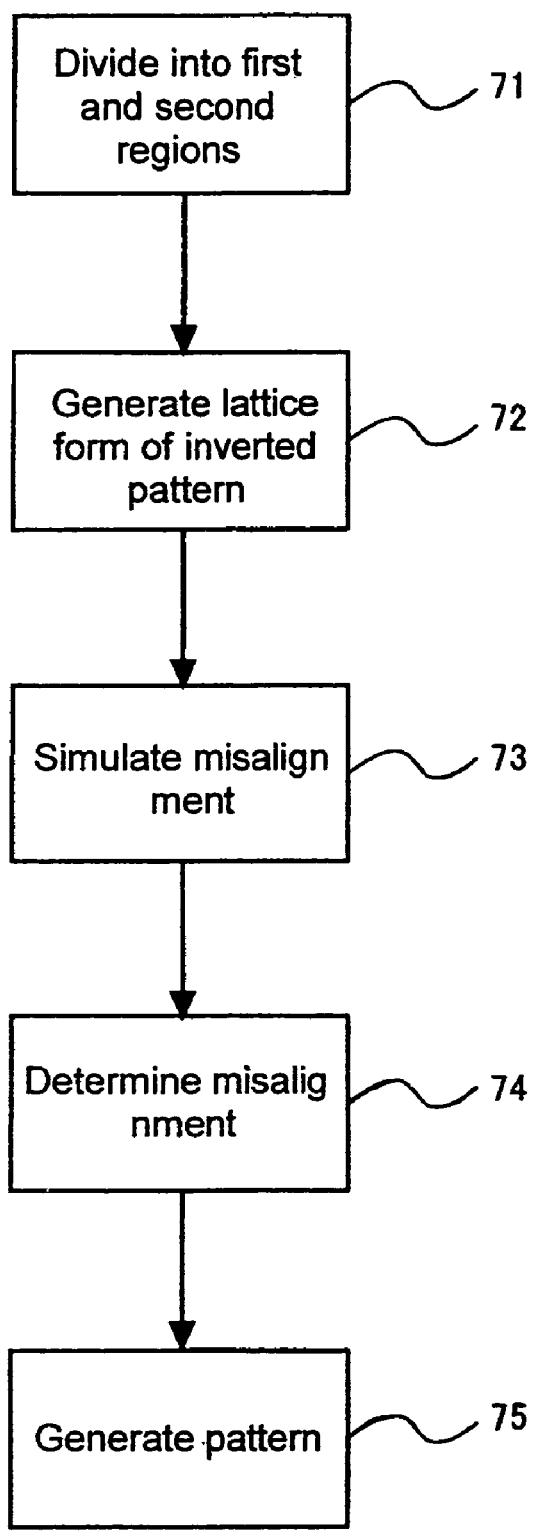
FIG. 8 is a flowchart showing the steps of a method of generating a mask pattern according to a fifth embodiment of the invention.

FIG. 8 is a flowchart showing the steps of a mask pattern generating method according to the fifth embodiment of the invention.

Step 71 is for dividing the substrate surface into the first and second regions. In this step, a layout pattern is input, and the active region of the semiconductor device in the layout pattern is divided into a plurality of groups based on a predetermined rule.

Step 72 is for generating the lattice form of an inverted pattern. In this step, an inverted pattern is generated for a specific one of the layout pattern groups divided in step 71, and further the inverted pattern is reshaped into a lattice form.

Step 73 is for determining the amount of surface misalignment. In this step, the manner in which the groups divided in step 71 and processed in step 72 are formed on the semiconductor substrate is calculated.

Step 74 is for determining misalignment. In this step, it is determined whether the result obtained in step 73 satisfies the limit of the surface misalignment permitted in the fabrication of a semiconductor device.

Step 75 is for generating a pattern. In this step, a mask pattern is generated through step 74.

In the manner described above, a mask pattern for etching is generated and output based on an input layout pattern.

Figure 9:
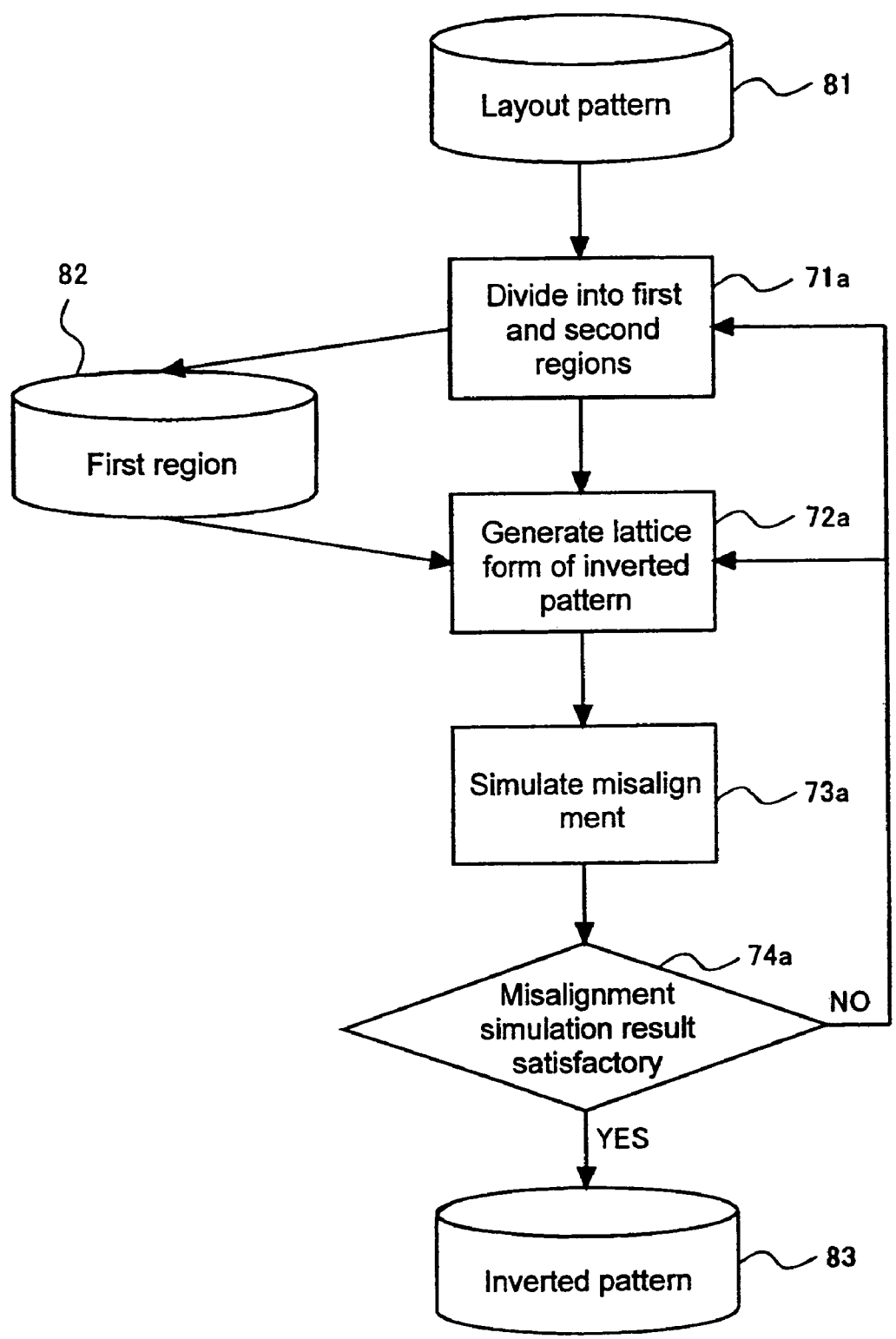
FIG. 9 is a flowchart showing a specific example according to the fifth embodiment of the invention.

FIG. 9 shows a specific example of this embodiment. A layout pattern 81 is input to a device 71a for dividing an active region into first and second regions corresponding to step 71 in FIG. 8. Based on a predetermined rule, the active region of the semiconductor device is divided into a first region 82 requiring the etching and a second region other than the first region 82.

An inverted pattern/lattice form generator 72a corresponding to step 72 in FIG. 8 generates an inverted pattern in the first region 82 based on a predetermined rule. A misalignment simulator 73a executes the process for simulating a misalignment corresponding to step 73 in FIG. 8. A collator 74a, on the other hand, executes the misalignment determining process corresponding to step 74 in FIG. 8, and in the case where the result of collation with the predetermined rule is satisfactory, outputs a mask pattern (inverted pattern) 83.

In the case where the result of the processing in the collator 74a is not satisfactory, on the other hand, the rule is altered for the first region/second region divider 71a and the inverted pattern lattice form generator 72a, and the subsequent process is repeated.

As a result, the rule for generating an inverted pattern can be optimized to suit the features of the layout pattern, thereby improving the flatness.

(Sixth Embodiment)

The sixth embodiment corresponds to the second embodiment in that a single opening is formed in the first region and lattice openings are formed in the second region.

In the sixth embodiment, an optimum mask pattern (inverted pattern) is determined based on the misalignment simulation.

Figure 10:
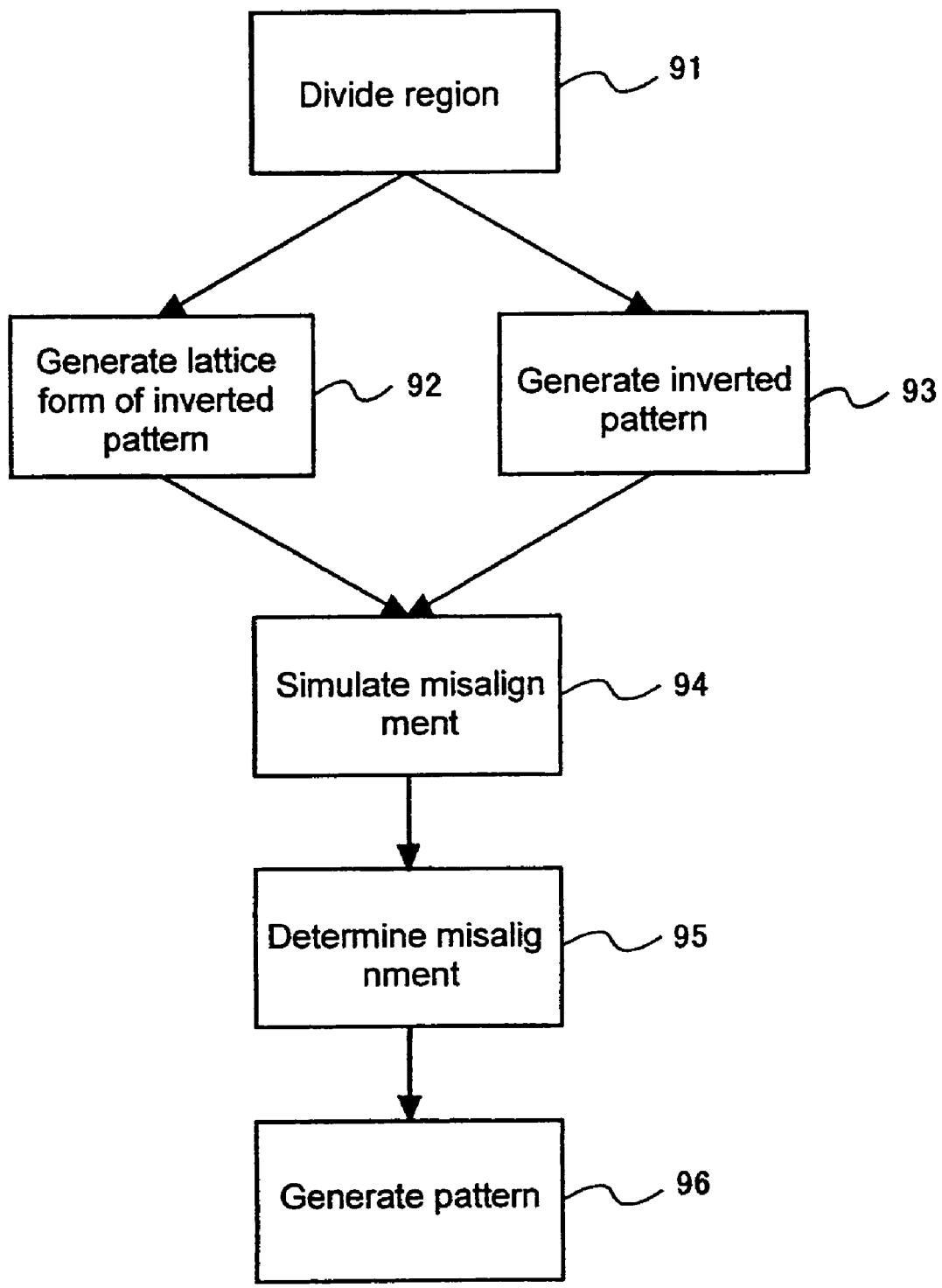
FIG. 10 is a flowchart showing the steps of a method of generating a mask pattern according to a sixth embodiment of the invention.

FIG. 10 is a flowchart showing the steps followed in a method of generating a mask pattern according to the sixth embodiment of the invention.

Step 91 is for dividing the substrate surface into regions. In this step, a layout pattern is input and an active region of the semiconductor device in the layout pattern is divided into a plurality of groups based on a predetermined rule.

Step 92 is for generating a lattice form of an inverted pattern. In this step, an inverted pattern is generated for a specific one of the layout pattern groups divided in step 91, and further the inverted pattern is reshaped into a lattice form.

Step 93 is for generating an inverted pattern. In this step, an inverted pattern is generated for a specific one of the layout pattern groups divided in step 91.

Step 94 is for determining the amount of surface misalignment. In this step, the manner in which a given group divided in step 91 and processed in step 92 is formed on the semiconductor substrate is calculated.

Step 95 is for determining misalignment. In this step, it is determined whether the result obtained in step 94 meets the limit of the surface misalignment permitted for semiconductor fabrication.

Step 96 is for generating a pattern. In this step, a mask pattern is generated through step 95.

As described above, a mask pattern for etching is generated and output based on an input layout pattern.

Figure 11:
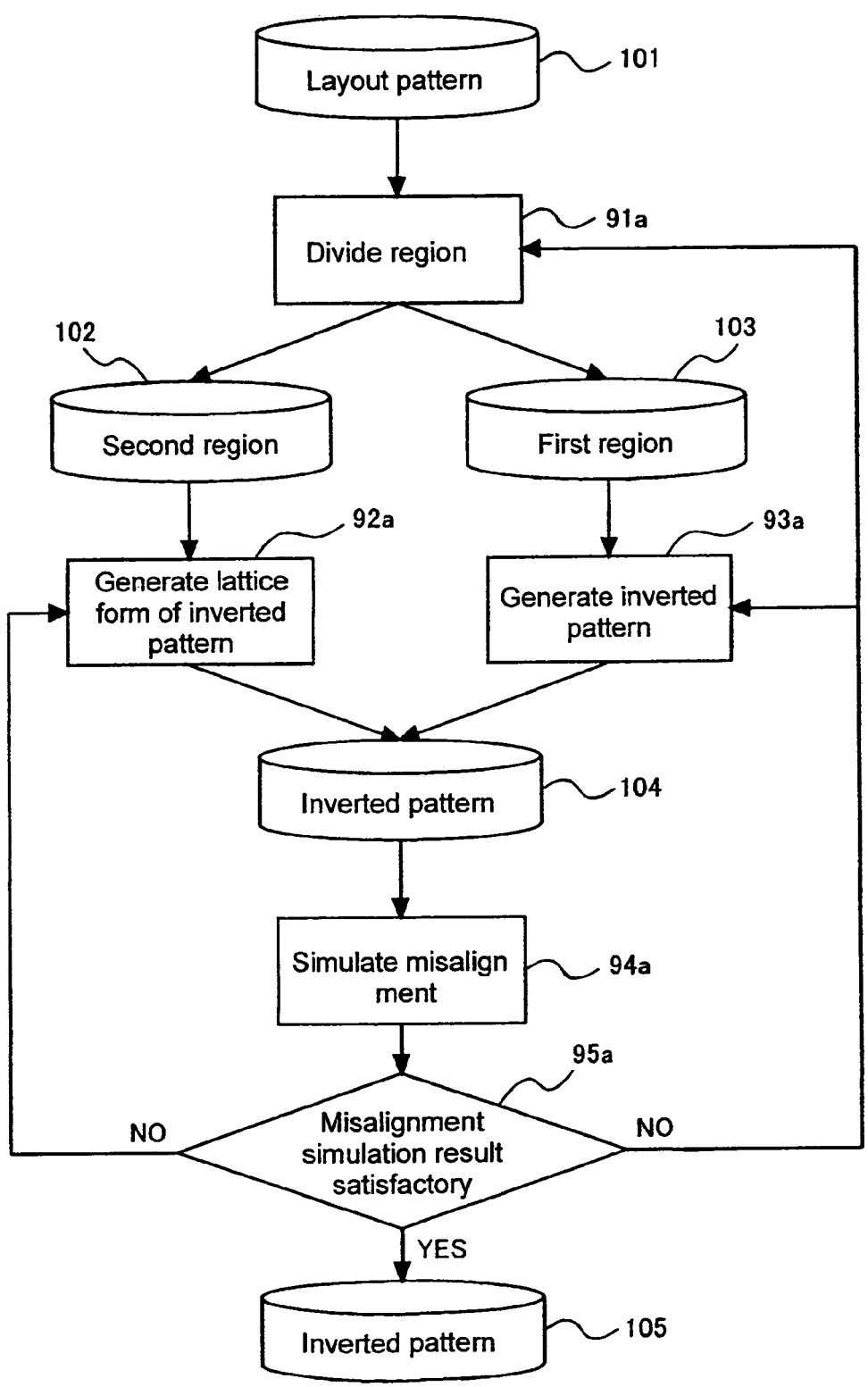
FIG. 11 is a flowchart showing a specific example according to the sixth embodiment of the invention.

FIG. 11 shows a specific example of this embodiment. A region divider 91a corresponding to the step 91 in FIG. 10 is supplied with a layout pattern 101 and it divides the active region of a semiconductor in a layout pattern into a first region 102, a second region 103 and another region based on a predetermined rule. The second region 102 is where an inverted pattern and a lattice form are generated, while only an inverted pattern is generated in the first region 103.

A device 92a for generating the lattice form of an inverted pattern corresponding to step 92 in FIG. 10 is supplied with the data on the second region 102 and generates a lattice form for an inverted pattern of the second region 102 in accordance with a predetermined rule. A device 93a for generating an inverted pattern corresponding to step 93 in FIG. 10, on the other hand, is supplied with the data on the first region 103 and generates an inverted pattern of the first region 103. The two patterns thus generated are combined to generate an inverted pattern 104.

A misalignment simulator 94a executes the process corresponding to step 94 in FIG. 10 to simulate a misalignment for altering the rule. A collator 95a executes the misalignment-determining process corresponding to step 95 in FIG. 10, and in the case where the result of collation with a predetermined rule is satisfactory, outputs a mask pattern (inverted pattern) 105.

In the case where the result of collation in the collator 95a is not satisfactory, on the other hand, the rule for the region divider 91a, the inverted pattern lattice form generator 92a and the inverted pattern generator 93a are altered, and the subsequent process is repeated.

In the way described above, with regard to a layout pattern having both an active region of a large area configured of a large pattern and an active region of a small area configured of a small pattern, the rule for generating an inverted pattern can be optimized to suit the features of the layout pattern, thereby making it possible to improve the flatness.

(Seventh Embodiment)

According to the seventh embodiment, the method of the first embodiment and the method of the second embodiment are replaced with each other in accordance with the degree of the surface misalignment.

Figure 12:
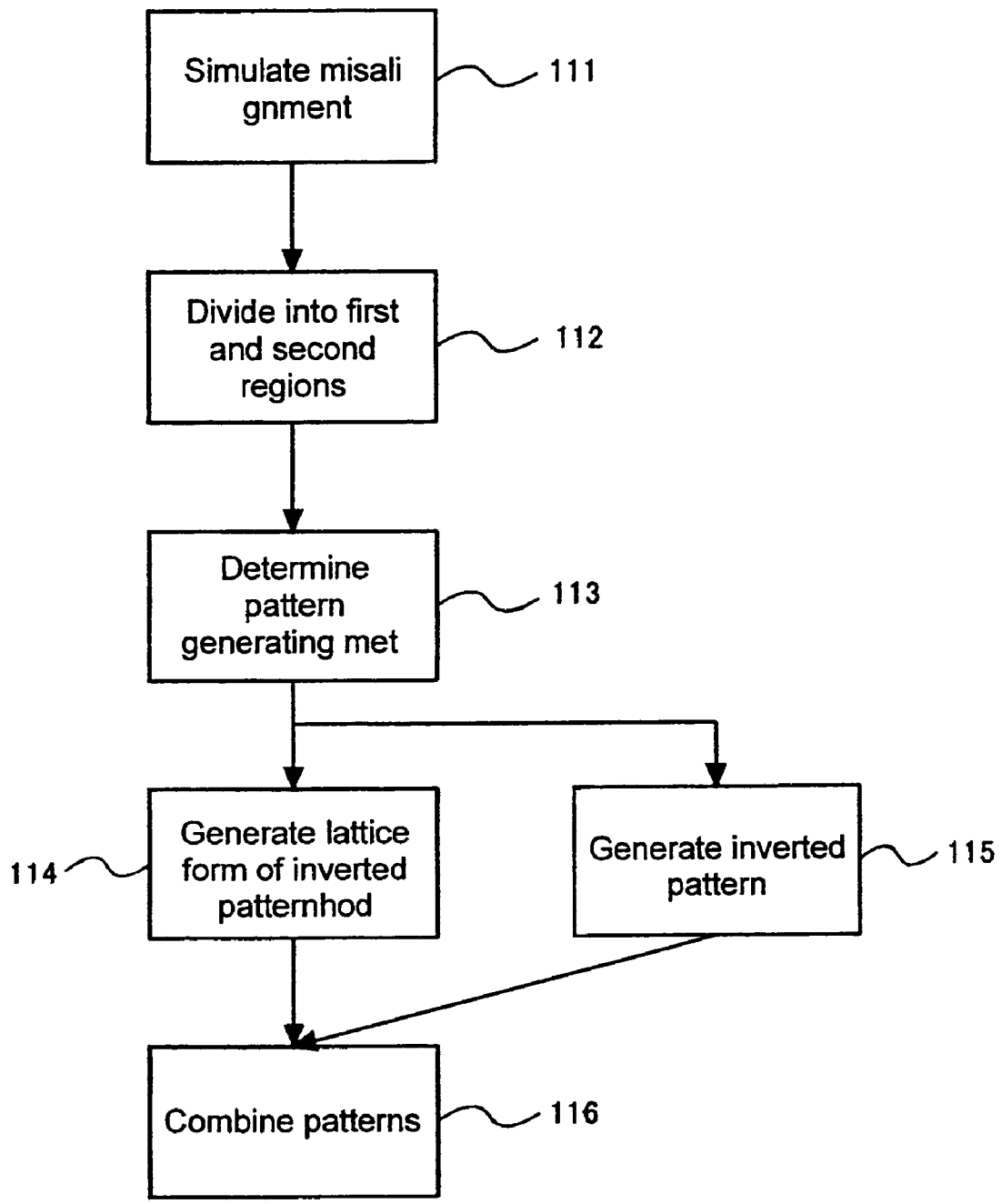
FIG. 12 is a flowchart showing the steps of a method of generating a mask pattern according to a seventh embodiment of the invention.

FIG. 12 is a flowchart showing the steps followed in a method of generating a mask pattern according to the seventh embodiment of the invention.

Step 111 is for simulating a misalignment for selecting a generating method. In this step, a layout pattern is input and the amount of surface misalignment of the semiconductor substrate is calculated based on a predetermined rule.

Step 112 is for dividing the substrate surface into a first region and a second region. In this step, the active region of a semiconductor device is divided into a plurality of groups based on a predetermined rule.

Step 113 is for determining a pattern generating method. In this step, an appropriate one of a plurality of methods for generating an inverted pattern is selected based on the result of step 111.

Step 114 is for generating a lattice form of an inverted pattern. In this step, an inverted pattern is generated for a specific one of the layout pattern groups divided in step 112, and further the inverted pattern is reshaped into a lattice form.

Step 115 is for generating an inverted pattern. In this step, an inverted pattern is generated for a specific one of the layout pattern groups divided in step 112.

Step 116 is for combining patterns. In this step, an inverted pattern is generated by combination through steps 114 and 115.

As described above, an inverted pattern for etching is generated and output based on an input layout pattern.

Figure 13:
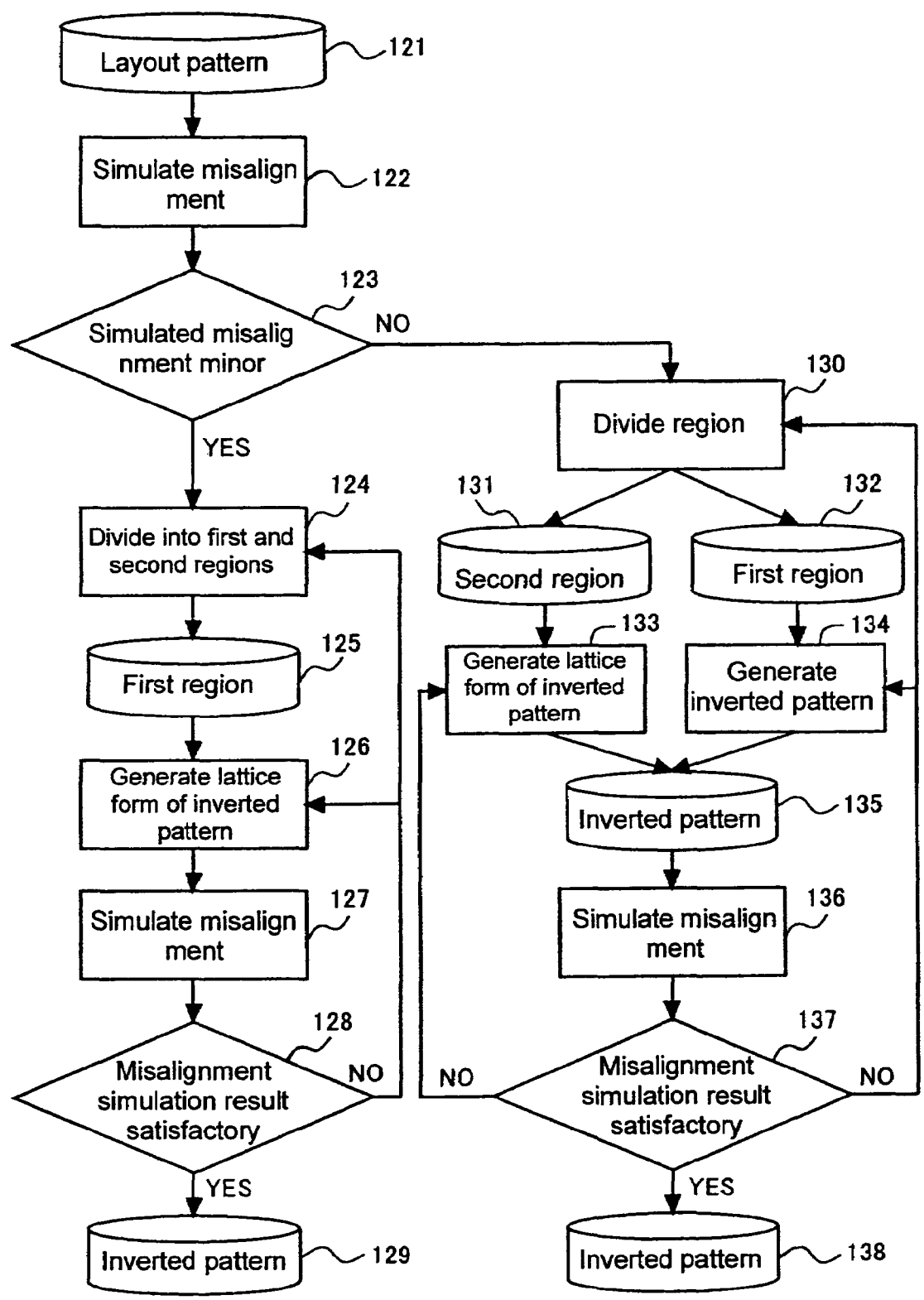
FIG. 13 is a flowchart showing a specific example according to the seventh embodiment of the invention.

FIG. 13 shows a specific example of this embodiment.

A misalignment simulator 122 for selecting a generating method carries out a misalignment simulation on the wafer surface after the CMP process based on an input layout pattern 121, and a generating method selector 123 determines whether the surface misalignment determined by simulation is minor or crucial. In the case where the surface misalignment is minor, the process is transferred to the first region/second region divider 124, while in the case where the surface misalignment is crucial, the process is transferred to the region divider 130.

The process from the first region/second region divider 124 to the inverted pattern 129 is similar to the corresponding process according to the fifth embodiment shown in FIG. 9. Also, the process from the region divider 130 to the inverted pattern 138 is similar to the corresponding process according to the sixth embodiment shown in FIG. 11. Reference numeral 71a in FIG. 9 corresponds to reference numeral 124 in FIG. 13. Similarly, numeral 82 corresponds to numeral 125, numeral 72a to numeral 126, numeral 73a to numeral 127, numeral 74a to numeral 128, and numeral 83 to numeral 129. Numeral 91a in FIG. 11 corresponds to numeral 130 in FIG. 13. Similarly, numeral 102 corresponds to 131, numeral 103 to numeral 132, numeral 92a to numeral 133, numeral 93a to numeral 134, numeral 104 to numeral 135, numeral 94a to numeral 136, numeral 95a to numeral 137, and numeral 105 to numeral 138. The technical contents are the same and will not be described again.

As a result, with regard to a layout pattern having both an active region of a large area configured of a large pattern and an active region of a small area configured of a small pattern, the rule for generating an inverted pattern can be optimized to suit the features of the layout pattern. Also, the shape and dimensions of an inverted pattern can be controlled independently of the size of the pattern of the active region, thereby making it possible to improve the flatness.

(Eighth Embodiment)

According to the eighth embodiment, a layout pattern is divided into regions of a specific size, the shape of and the rule for an inverted pattern are controlled based on the calculation of the pattern density in the region.

Figure 14:
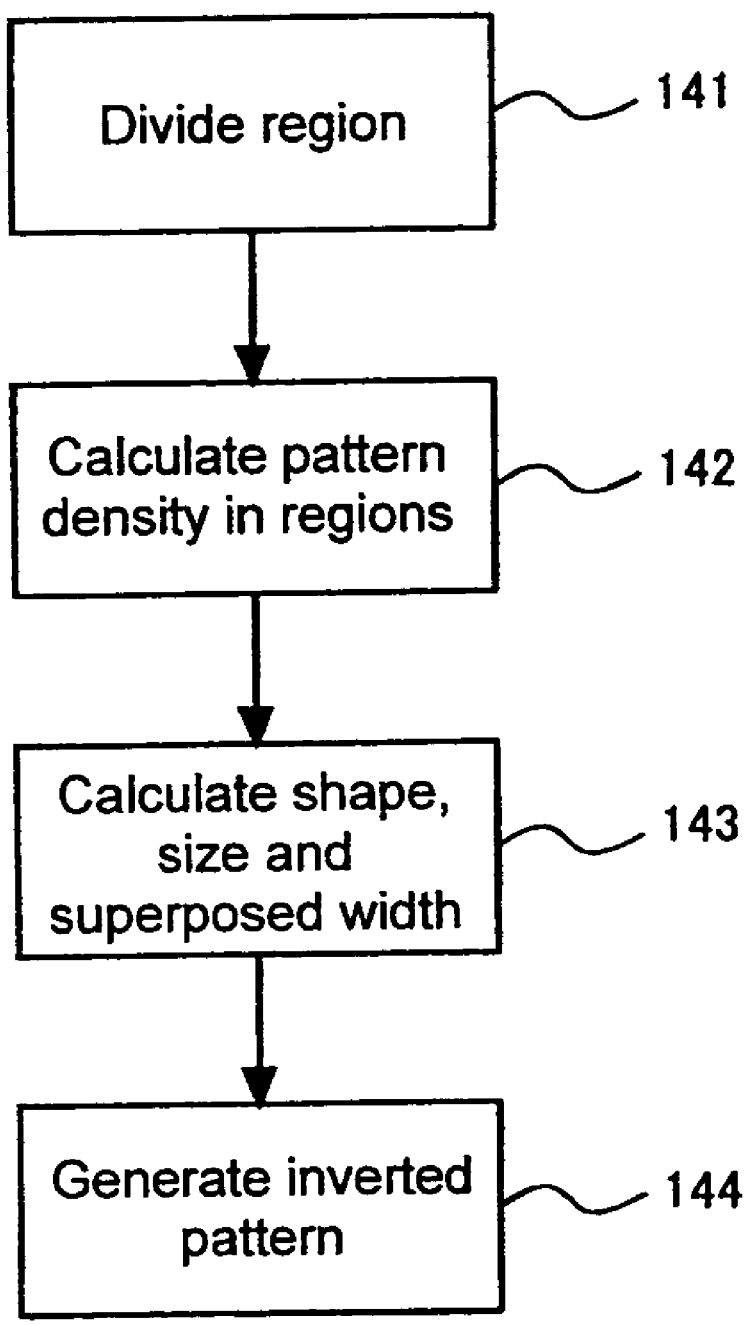
FIG. 14 is a flowchart showing the steps of a method of generating a mask pattern according to an eighth embodiment of the invention.

FIG. 14 is a flowchart showing the steps followed in a method of generating a mask pattern according to the eighth embodiment of the invention.

Step 141 is for dividing a layout pattern into regions of a specific size. Step 142 is for calculating the density of the pattern in each divided region. Step 143 is for calculating the shape and dimensions of an inverted pattern and the superposed width of the inverted pattern with the active region. Step 144 is for generating an inverted step.

Figure 15:
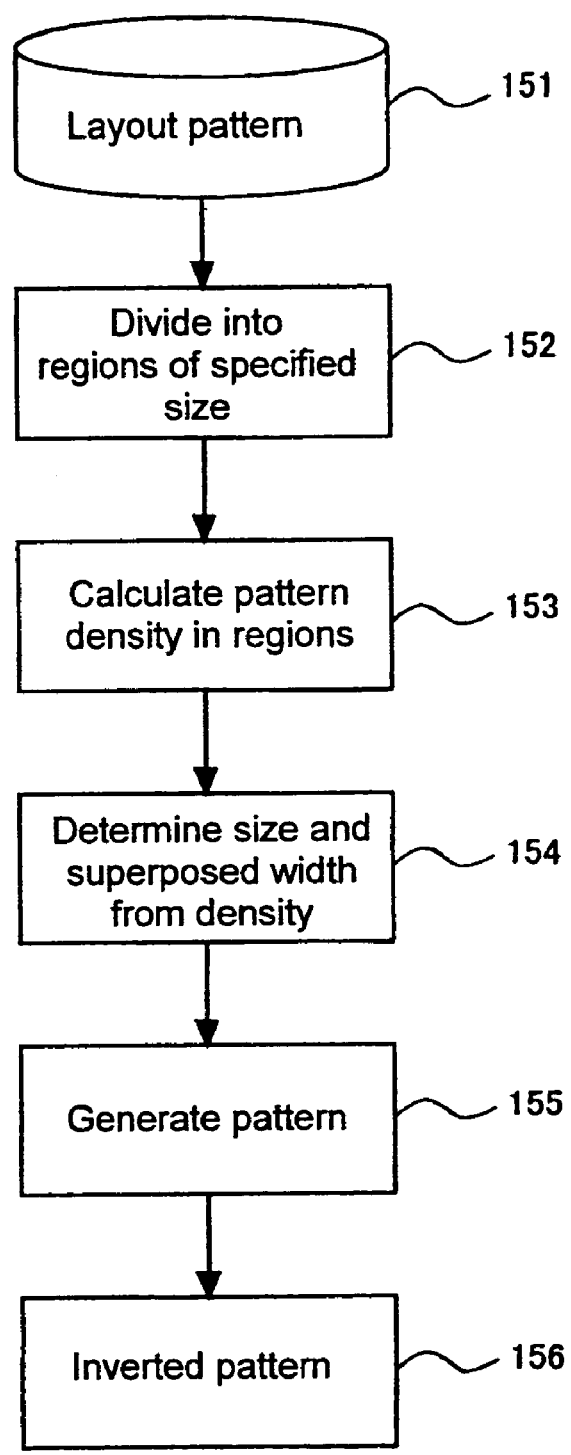
FIG. 15 is a flowchart showing a specific example according to the eighth embodiment of the invention.

FIG. 15 shows a specific example of this embodiment.

In step 152, an input layout pattern 151 is divided into regions of a predetermined specific size. In step 153, the density of a pattern in the divided regions is calculated. In step 154, the size and the superposed width of the inverted pattern are determined based on the pattern density obtained by the calculation. In step 155, a master pattern (inverted pattern) 156 is generated.

As a result, an inverted pattern can be generated based on the features of a pattern for a region of an appropriate size in addition to the shape and size of the pattern for the active region, thereby making it possible to improve the flatness.

As described above, according to this invention, a lattice portion is added to a single opening in a first region having a relatively large area, or lattice openings are added to an openingless portion in a second region having a relatively small area. With this configuration, the insulating film presence is equalized between the first and second regions. Specifically, the thickness reduction rate of an insulating film can be equalized over the entire surface of the insulating film in the polish-off process. Consequently, the local over-polishing is prevented, and the misalignment between the surface of the insulating film in the region dividing grooves and the surface of the semiconductor substrate can be reduced, so that the surface height of the two surfaces can be equalized. Thus, the flatness of the surface of the semiconductor substrate and hence the characteristics of the semiconductor device are improved.

From the above description, it is apparent what the present invention provides.

What is claimed is:

1. A method of fabricating a semiconductor device, comprising:

a first step for forming a semiconductor substrate into a first region constituting an active region of a first area defined by adjacent region dividing grooves and a second region constituting an active region of a second area different in size than the first area adjacent to the first region;

a second step for forming an insulating film on the surface of the semiconductor substrate including the interior of the region dividing grooves;

a third step for etching the insulating film using an etching mask having a window pattern having at least two openings in such a manner that the openings corresponding to the window pattern are formed in the first region; and a fourth step for polishing off the insulating film remaining on the semiconductor substrate.

2. A method of fabricating a semiconductor device as claimed in claim 1, wherein the at least two openings corresponds to a lattice pattern.

3. A method of fabricating a semiconductor device as claimed in claim 1, wherein following the third step, the insulating film above the second region is continuous.

4. A method of fabricating a semiconductor device as claimed in claim 1, wherein the first area is larger than the second area.

5. A method of fabricating a semiconductor device, comprising: a first step for forming at least a region dividing groove for separating the surface of a semiconductor substrate into a first region constituting an active region of a relatively large area and a second region constituting an active region of a relatively small area; a second step for forming an insulating film on the surface of the semiconductor substrate including the interior of the region dividing groove; a third step for etching the insulating film using an etching mask having a single opening pattern and a lattice window pattern in such a manner that a single opening corresponding to the single opening pattern is formed in the first region and lattice openings corresponding to the lattice window pattern are formed in the second region; and a fourth step for polishing off the insulating film remaining on the semiconductor substrate.

6. A method of fabricating a semiconductor device as claimed in claim 5, wherein the lattice window pattern of the etching mask has a superposed width with the active region set to a value smaller than the superposed width with the single opening pattern.

* * * * *